United States Patent
Hsiao et al.

(10) Patent No.: US 9,455,708 B2
(45) Date of Patent: Sep. 27, 2016

(54) DYNAMICALLY ADJUSTABLE CIRCUIT WITH CIRCUIT OF CHARACTERIZED-PATH AND METHOD FOR GENERATING CIRCUIT OF CHARACTERIZED-PATH

(71) Applicant: INDUSTRIAL TECHNOLOGY RESEARCH INSTITUTE, Hsinchu (TW)

(72) Inventors: Kuo-Su Hsiao, Chiayi County (TW); Chun-Yuan Cheng, Yunlin County (TW); Chi-Tien Sun, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/569,023

(22) Filed: Dec. 12, 2014

(65) Prior Publication Data

US 2015/0188541 A1 Jul. 2, 2015

(30) Foreign Application Priority Data

Dec. 27, 2013 (TW) .............................. 102148864 A

(51) Int. Cl.
| | | |
|---|---|---|
| *H03K 19/00* | (2006.01) | |
| *H03K 19/01* | (2006.01) | |
| *H03K 19/017* | (2006.01) | |

(52) U.S. Cl.
CPC .......... *H03K 19/0008* (2013.01); *H03K 19/01* (2013.01); *H03K 19/017* (2013.01)

(58) Field of Classification Search
CPC .... G06F 1/3296; G06F 1/3203; G06F 1/324; G06F 1/26; G06F 1/3293; G06F 17/5031; G06F 17/5045; G06F 17/5081; G06F 11/008; Y02B 60/1285; Y02B 60/1217; H03K 5/135; H03K 19/0016; H03K 2005/00058; H03K 19/00346; H03K 5/133; H03K 19/0008; H03K 19/00369
See application file for complete search history.

(56) References Cited

U.S. PATENT DOCUMENTS

| 5,814,845 A | 9/1998 | Carley |
|---|---|---|
| 6,605,981 B2 | 8/2003 | Bryant et al. |

(Continued)

FOREIGN PATENT DOCUMENTS

| CN | 102063144 A | 5/2011 |
|---|---|---|
| TW | I368851 | 7/2012 |

OTHER PUBLICATIONS

Jinn-Shyan Wang et al., A 0.36V, 33.3μW 18-Band ANSI S1.11 ⅓-Octave Filter Bank for Digital Hearing Aids in 40nm CMOS, Symposium on VLSI Circuits Digest of Technical Papers, 2013, C254-C255.

(Continued)

*Primary Examiner* — Jany Richardson
(74) *Attorney, Agent, or Firm* — Locke Lord LLP; Tim Tingkang Xia, Esq.

(57) ABSTRACT

An integrated circuit and a method are provided. An integrated circuit comprises a first circuit, with a first character and at least one external control signal, and a character control unit. The character control unit controls the at least one external control signal and has a second circuit, with a second character essentially proportional to the first character, a character adjuster for adjusting the at least one external control signal, and a character monitor for monitoring the operation behavior of the second circuit to control the character adjuster to adjust the at least one external control signal accordingly.

10 Claims, 13 Drawing Sheets

(56) References Cited

U.S. PATENT DOCUMENTS

| | | |
|---|---|---|
| 7,089,443 B2 | 8/2006 | Albonesi et al. |
| 7,131,089 B2 | 10/2006 | Issa et al. |
| 7,162,652 B2 | 1/2007 | Issa et al. |
| 7,197,733 B2 | 3/2007 | Issa et al. |
| 7,327,185 B2 | 2/2008 | Mair et al. |
| 7,417,482 B2 | 8/2008 | Elgebaly et al. |
| 7,519,925 B2 | 4/2009 | Issa et al. |
| 7,525,373 B1 | 4/2009 | Ogilvie et al. |
| 7,739,537 B2 | 6/2010 | Albonesi et al. |
| 8,138,795 B2 | 3/2012 | Hseih et al. |
| 2004/0183588 A1* | 9/2004 | Chandrakasan et al. ..... 327/545 |
| 2009/0289615 A1* | 11/2009 | Foley .................. G06F 1/3203 323/318 |
| 2010/0208498 A1 | 8/2010 | Rubio et al. |
| 2013/0007413 A1 | 1/2013 | Thomson et al. |

OTHER PUBLICATIONS

Tay-Jyi Lin et al., A 0.48V 0.57nJ/Pixel Video-Recording SoC in 65nm CMOS, IEEE International Solid-State Circuits Conference, 2013,158-159.

Shailendra Jain et al., A 280mV-to-1.2V Wide-Operating-Range IA-32 Processor in 32nm CMOS, IEEE International Solid-State Circuits Conference, 2012, 66-67.

James Tschanz et al., A 45nm Resilient and Adaptive Microprocessor Core for Dynamic Variation Tolerance, IEEE International Solid-State Circuits Conference, 2010, 282-283.

Alan Drake et al., A Distributed Critical-Path Timing Monitor for a 65nm High-Performance Microprocessor, IEEE International Solid-State Circuits Conference, 2007, 398-399.

Junyoung Park et al., A Fast, Accurate and Simple Critical Path Monitor for Improving Energy-Delay Product in DVS Systems, IEEE, 2011, 391-396.

David Bull et al., A Power-Efficient 32 bit ARM Processor Using Timing-Error Detection and Correction for Transient-Error Tolerance and Adaptation to PVT Variation, IEEE Journal of Solid-State Circuits, 2011, 18-27, vol. 46, No. 1.

Alice Wang et al., An 180mV FFT processor using sub-threshold circuit techniques, IEEE International Solid-State Circuits Conference, 2004.

Wayne H. Cheng et al., Dynamic Voltage and Frequency Scaling Circuits with Two Supply Voltages, IEEE, 2008, 1236-1239.

Kwanyeob Chae et al., Low-Power Design under Variation using Error Prevention and Error Tolerance, IEEE, 2012.

Fred Pollack et al., New Microarchitecture Challenges in the Coming Generations of CMOS Process Technologies, IEEE Computer Society Washington, DC, USA, 1999.

Yu-Huei Lee et al., On-the-fly Dynamic Voltage Scaling (DVS) in 65nm Energy-Efficient Power Management with Frequency-Based Control (FBC) for SoC System, IEEE Asian Solid-State Circuits Conference, 2011, 329-332.

Mircea R. Stan, Optimal Voltages and Sizing for Low Power, 1999, Proceedings Twelfth International Conference on Source: IEEE Xplore.

Koichi Nose et al., Optimization of VDD and VTH for Low-power and High-speed Applications, IEEE, 2000, 469-474.

Dan Ernst et al., Razor: A Low-Power Pipeline Based on Circuit-Level Timing Speculation, IEEE Computer Society, Proceedings of the 36th International Symposium on Microarchitecture, 2003.

James Tschanz et al., Resilient Circuits—Enabling Energy-Efficient Performance and Reliability, IEEE/ACM International Conference on Computer-Aided Design Digest of Technical Papers, 2009, 71-73.

James Kao et al., Subthreshold Leakage Modeling and Reduction Techniques, IEEE, 2002, 141-148.

Ricardo Gonzalez et al., Supply and Threshold Voltage Scaling for Low Power CMOS, IEEE Journal of Solid-State Circuits, 1997, 1210-1216, vol. 32, No. 8.

Mark P. Mills, The Cloud Begins with Coal Big Data, Big Networks, Big Infrastructure, and Big Power, National Mining Association American Coalition for Clean Coal Electricity, 2013, 1-45.

Nikos Hardavellas et al., Toward Dark Silicon in Servers, IEEE Computer Society, 2011, 6-15.

James Tschanz et al., Tunable replica circuits and adaptive voltage-frequency techniques for dynamic voltage, temperature, and aging variation tolerance, Symposium on VLSI Circuits Digest of Technical Papers, 2009, 112-113.

Augustus K. Uht, Uniprocessor Performance Enhancement Through Adaptive Clock Frequency Control, IEEE Computer Society, 2005, 132-140.

\* cited by examiner

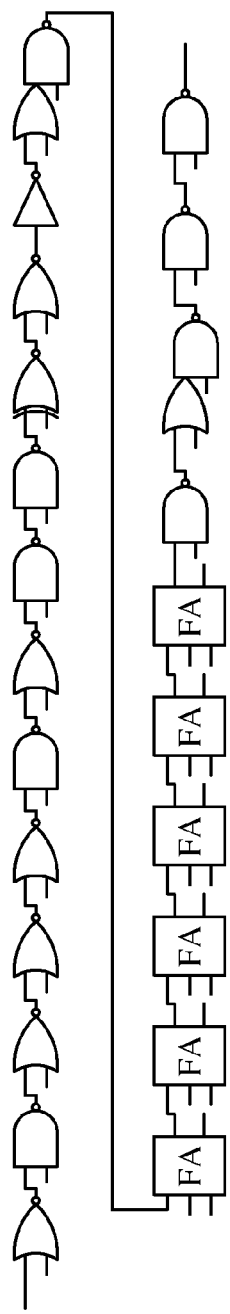
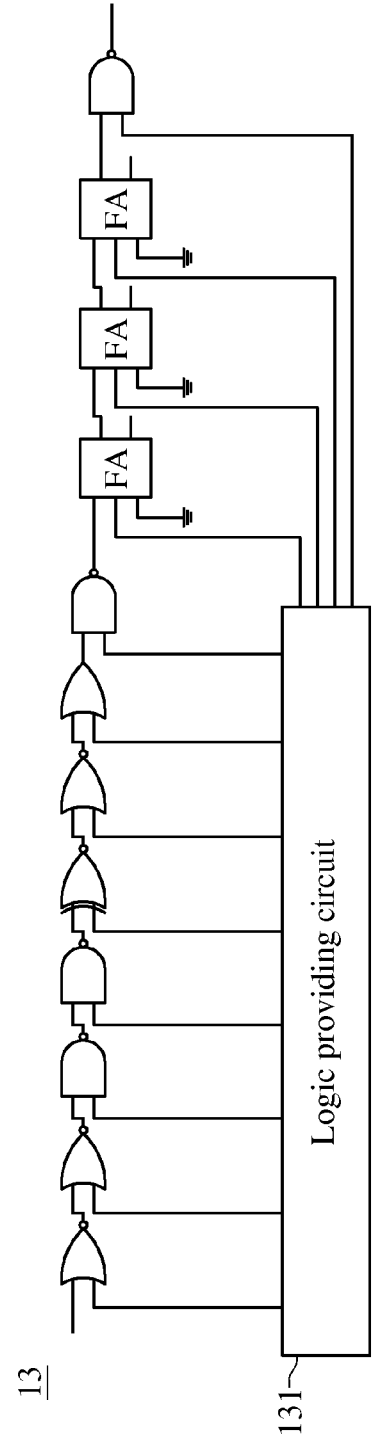
FIG.2A
FIG.2B

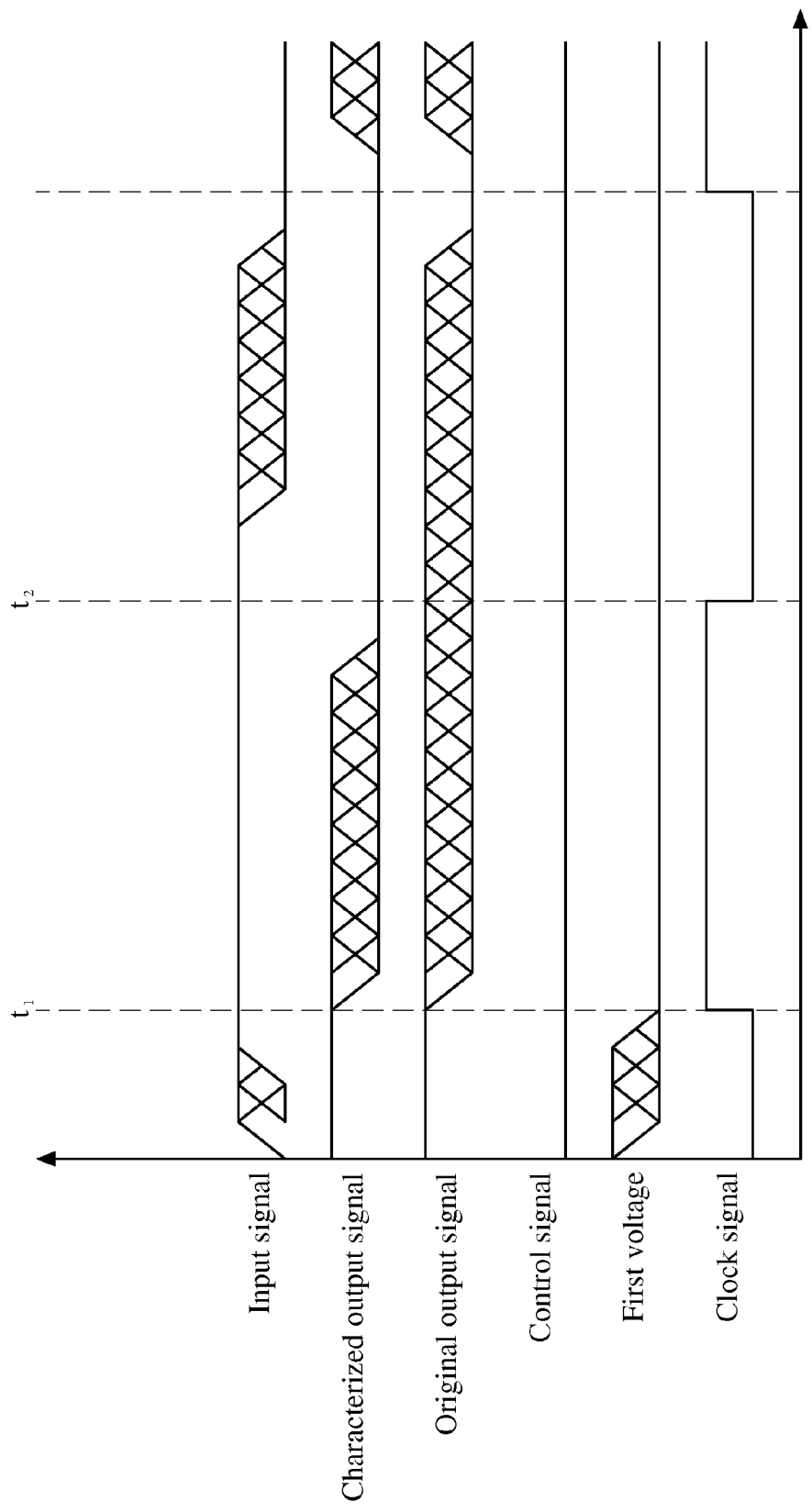

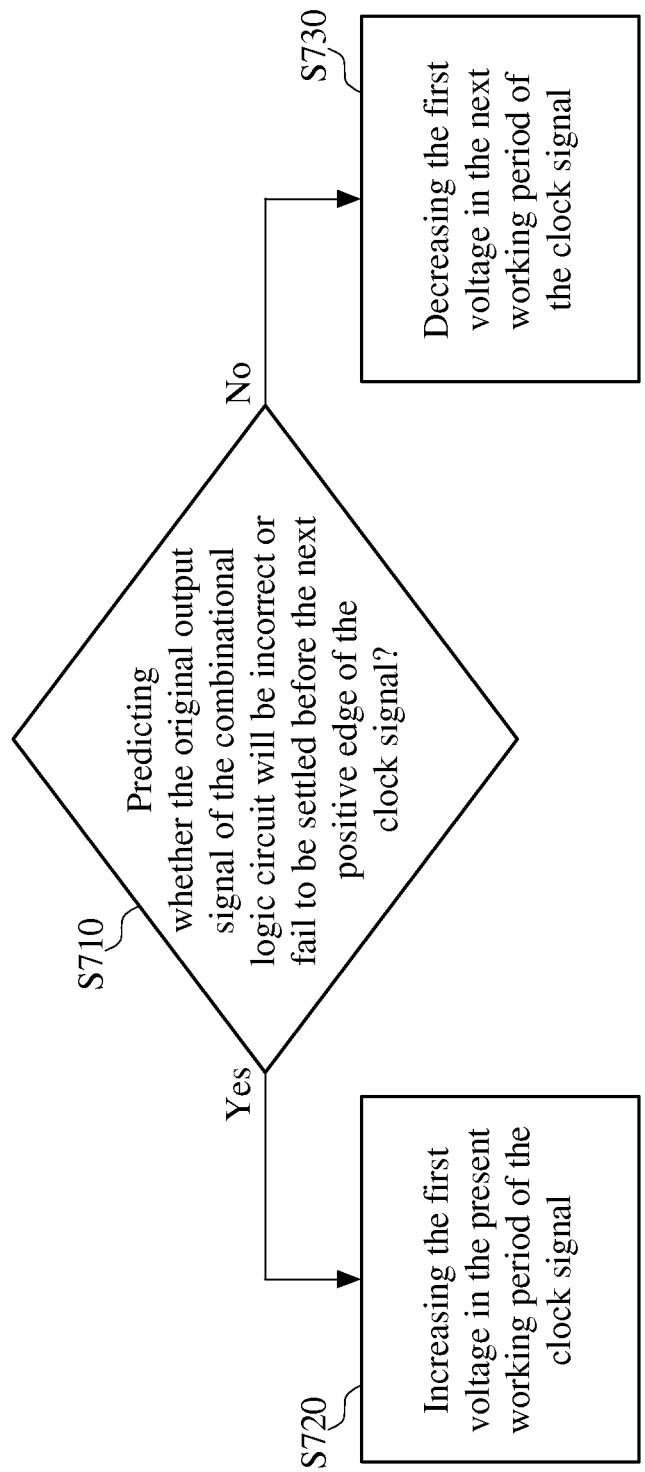

DYNAMICALLY ADJUSTABLE CIRCUIT WITH CIRCUIT OF CHARACTERIZED-PATH AND METHOD FOR GENERATING CIRCUIT OF CHARACTERIZED-PATH

CROSS REFERENCE

The present application is based on, and claims priority from, Taiwan Application Serial Number 102148864, filed on Dec. 27, 2013, the disclosure of which is hereby incorporated by reference herein in its entirety.

TECHNICAL FIELD

The present disclosure generally relates to a digital circuit and more particularly to a dynamically adjustable circuit with a circuit of the characterized-path and a method for generating the circuit of the characterized-path.

BACKGROUND

It is needed to improve the power efficiency of the integrated circuit. The low voltage integrated circuit consumes less power, but comes with slower operation speed that limits the operation frequency of the low voltage integrated circuit. As a consequence, how to achieve low power consumption and keep operation frequency of the low voltage integrated circuit is a problem to be solved.

SUMMARY

In one or more exemplary embodiments of this disclosure, an integrated circuit comprises a first circuit, with a first character and at least one external control signal, and a character control unit. The character control unit controls the at least one external control signal and has a second circuit, with a second character essentially proportional to the first character, a character adjuster for adjusting the at least one external control signal, and a character monitor for monitoring the operation behavior of the second circuit to control the character adjuster to adjust the at least one external control signal accordingly.

In one or more exemplary embodiments of this disclosure, a method for generating a characterized-path may comprise: providing a first circuit, analyzing a first character associated with the first circuit, and generating a second circuit with a second character essentially proportional to the first character.

In one or more exemplary embodiments of this disclosure, a method for dynamically adjusting the character of an integrated circuit comprises: providing a first circuit with a first character, providing a second circuit with a second character essentially proportional to the first character, and within a clock period of the first circuit, monitoring an operation behavior of the second circuit and adjusting at least one external control signal of the first circuit based on the operation behavior.

In order to make the aforementioned and other features of the present disclosure more comprehensible, several embodiments accompanied with figures are described in detail below.

BRIEF DESCRIPTION OF THE DRAWINGS

The present disclosure will become more fully understood from the detailed description given herein below for illustration only, and thus are not limitative of the present disclosure, and wherein:

FIG. 2A is a schematic of the circuit of critical-path in accordance with one embodiment of this disclosure;

FIG. 2B is a schematic of the circuit of characterized-path corresponding to the circuit of critical-path in FIG. 2A in accordance with one embodiment of this disclosure;

FIG. 3A is the timing diagram for a plurality of signals when the original output signal meets the timing requirement;

FIG. 7 is a flowchart of the control method of the dynamically adjustable circuit in accordance with one embodiment of this disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In one or more exemplary embodiment of this disclosure, a dynamically adjustable circuit is disclosed. In the disclosed dynamically adjustable circuit, a circuit of the characterized-path is used to represent whether the circuit of the critical-path meets functional requirements or not.

When the output of the circuit of the characterized-path indicates that the first character is going to fail to meet the functional requirement, the supply voltage of the original critical path is increased so that the first character is improved or the path delay of the original critical path is reduced. In certain embodiments, the body bias voltage of the n-type metal-oxide semiconductor field effect transistor (MOSFET) may be increased, and/or the body bias voltage of the p-type MOSFET may be decreased so that the timing metrics of the original output signal of the combinational logic circuit and/or the first characteristic may meet the requirement of the circuit. In the disclosure, a method for generating the circuit of the characterized-path is disclosed. The supply voltage and the body bias voltage may be represented as a first voltage in this disclosure. In yet another embodiment, the voltage of the source terminal of the p-type MOSFET may be adjusted so that the timing metrics of the original output signal of the combinational logic circuit and/or the first character may meet the requirement of the circuit.

Figure 1:
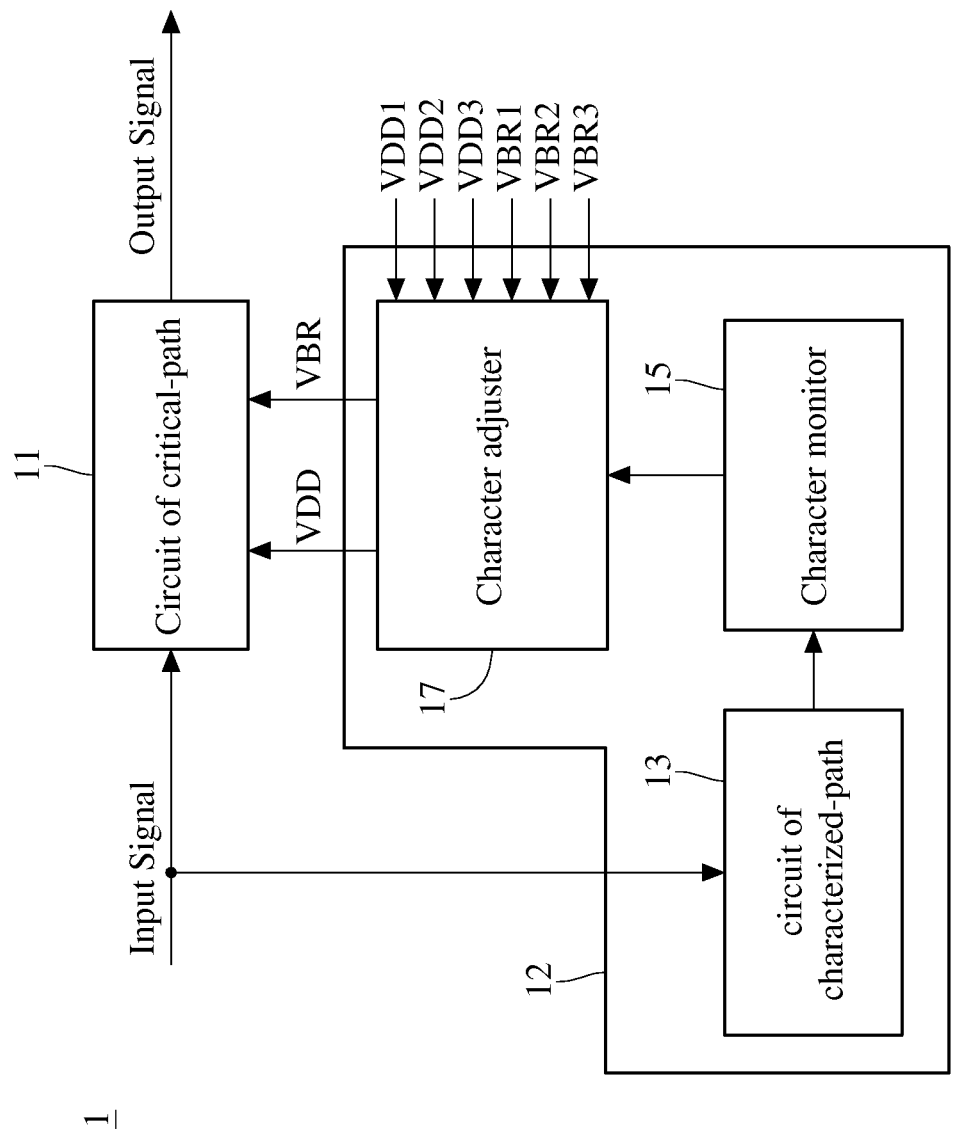
FIG. 1 is a functional block diagram of the dynamically adjustable circuit in accordance with one embodiment of this disclosure.

Please refer to FIG. 1, which is a block diagram of an exemplary system, with dynamic character control, that may reduces power consumption by dynamically character control in accordance with one embodiment of this disclosure. As shown in FIG. 1, the exemplary system 1 may comprise circuits for designed functions that have at least one circuit of the critical-path 11. In the lower part of the FIG. 1, the exemplary system 1 may comprise a character control unit 12 that includes a circuit of characterized-path 13, a character monitor 15, and a character adjuster 17.

The character adjuster 17 has outputs coupled to the circuit of the selected path, which is also called the circuit of the critical-path 11, and inputs coupled to the character monitor 15. Besides, a plurality of supply voltages VDD1~VDD3 and/or a plurality of body reference voltages VBR1~VBR3 are coupled to the character adjuster 17. Based on the input from the character monitor 15, the character adjuster 17 selects one supply voltage and one body reference as output coupled to the selected path. In this embodiment, the supply voltages VDD1~VDD3 and/or the body reference voltages VBR1~VBR3 are also called the external control signals of the circuit of the critical-path 11 for their usage of tuning the character of the circuit of the critical-path 11.

Although the embodiment disclosed in this disclosure comprises one circuit of the critical-path 11 and one circuit of the characterized-path 13, the embodiment is not to limit the scope of this disclosure. Any applications utilizing the concept of the circuit of the characterized-path of this disclosure fall in the claimed scope according to the claim of this disclosure.

Each of the circuit of the critical-path 11 and the non-critical path circuits in the exemplary system 1 is configured to generate an output signal according to an input signal. Specifically, the circuit generates one or more output signals according to at least one input signal, wherein there is a selected path may comprise a plurality of logic gates. Accordingly, the exemplary system 1 comprises a plurality of logic paths, and at least one logic path among the plurality of logic paths has a path delay greater than a delay threshold. Each of such logic paths is a circuit of the critical-path 11.

In this embodiment, the circuit of the critical-path 11 may have one or more logic gates, and there may be one or more first type MOSFET in each logic gates.

In another embodiment, power dissipation of all the logic gates of a logic path is greater/smaller than a power threshold may be treated as the selected (critical) path. Yet in another embodiment, all logic gates of a logic path with a noise margin less than a noise margin threshold may be treated as the selected path.

The circuit of the characterized-path 13 and the circuit of the critical-path 11 have at least one character in common or similar, so the characterized-path may be applied to generate a character output to indicate the performance of the selected path.

In one embodiment, the circuit of the characterized-path 13 has character similar to the circuit of the critical-path 11, and the path delay of the circuit of the characterized-path 13 is less than the path delay of the circuit of the critical-path 11. Hence, the circuit of the characterized-path 13 may be applied to indicate whether the operation of the circuit of the critical-path 11 meets the circuit requirement.

In another embodiment, the circuit of the characterized-path 13 may has at least one logic gate that is used in the circuit of the critical-path 11, so the circuit of the characterized-path 13 may be used to determine whether the noise margin of the circuit of the critical-path 11 is large enough.

The requirement of the exemplary system 1 about the original path delay and/or the noise margin of the circuit of the critical-path 11 may be called as the circuit requirement.

Briefly speaking, the circuit of the characterized-path 13 may be used for simulating the path delay, power consumption, power efficiency, logic complexity, and/or the noise margin of the circuit of the critical-path 11.

To illustrate the operation of the circuit of the characterized-path 13, take the path delay as an example. In one example, please refer to FIG. 2A and FIG. 2B, wherein FIG. 2A is a schematic of the circuit of the critical-path 11 in accordance with one embodiment of this disclosure and FIG. 2B is a schematic of the circuit of the characterized-path 13 corresponding to the circuit of the critical-path 11 in FIG. 2A in accordance with one embodiment of this disclosure. As shown in FIG. 2A, the circuit of the critical-path 11 has one NOT-gate, six NOR-gates, seven NAND-gates, two OR-AND-Invert gates (OAI-gate), one XNOR-gate, and six full adders (FA). The floating input ends of the said logic units indicate the input signal from other logic units (not illustrated).

As shown in FIG. 2B, the circuit of the characterized-path 13 may have three NOR-gates, three NAND-gates, one OAI-gate, one XNOR-gate, three full adders, and a logic providing circuit 131. The logic providing circuit 131 provides a predetermined logic level to at least one input end of each logic unit among the circuit of the characterized-path 13, and the predetermined logic level for one input end among the circuit of the characterized-path 13 may be different from the predetermined logic level for another input end among the circuit of the characterized-path 13. Meanwhile, the gate delay of each logic unit in FIG. 2B is moderately adjusted so that the path delay of the circuit of the characterized-path 13 in FIG. 2B is half of the path delay of the circuit of the critical-path 11 in FIG. 2A.

For example, if the path delay of the circuit of the critical—path 11 is shorter than one cycle of the clock signal, the path delay of the circuit of the characterized-path 13 should be shorter than half of one cycle of the clock signal. As a consequence, if the output of the circuit of the characterized-path 13 cannot be settled before the present negative edge of the clock signal, it represents that the output of the circuit of the critical path 11, which is a positive edge triggered logic circuit, cannot be settled before the next positive edge of the clock signal.

If the output of the characterized-path fails to be settled before a negative edge of the clock signal, the character adjuster adjusts the first voltage supplied to the circuit of the critical-path 11 so as to shorten the path delay of the circuit of the critical-path 11 to avoid error. After such adjustment, the output the selected path should be settled before the next positive edge of the clock signal.

In this embodiment, the path delay of the circuit of the characterized-path 13 is half of the path delay of the circuit of the critical-path 11. The path delay of the circuit of the characterized-path can be designed longer or shorter but not only limited in half path delay of critical path.

Figure 3B:
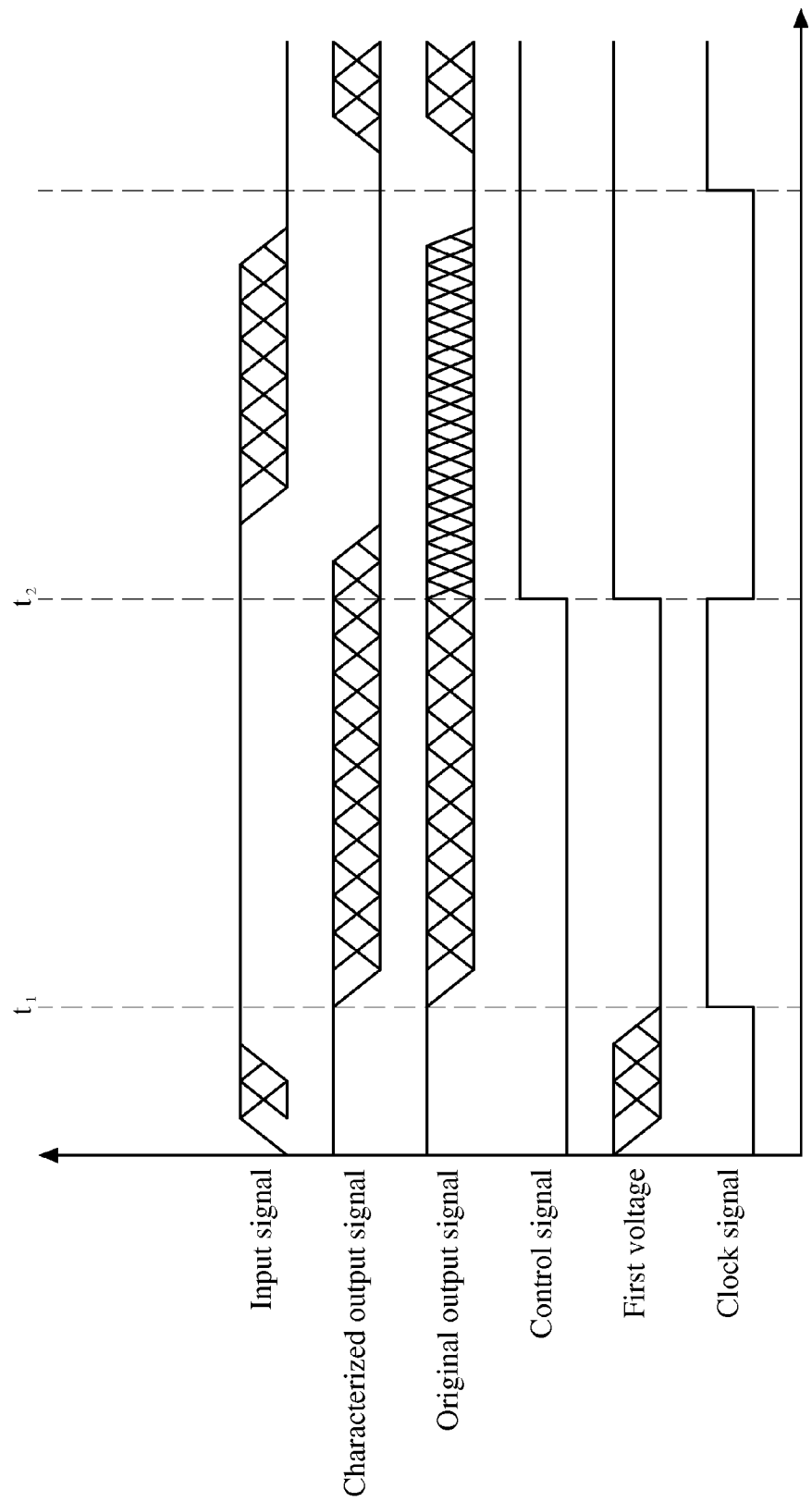
FIG. 3B is the timing diagram for a plurality of signals when the original output signal is predicted to fail to meet the timing requirement.

In one embodiment, the character monitor generates the control signal based on the operating behavior of the circuit of the characterized-path 13. Please refer to FIG. 3A and FIG. 3B, wherein FIG. 3A is the exemplary timing diagram that shows the normal case of the dynamic character-adjusting. FIG. 3B is the exemplary timing diagram that shows the output of selected path is going to fail the timing requirement and is corrected by increasing supply voltage. As shown in FIG. 3A, the clock signal rises at the time point $t_1$ (a positive edge of the clock signal), the critical path starts to operate and to generate the corresponding output according to the input. Meanwhile, the characterized-path starts to operate at $t_1$.

In the present embodiment, as shown in FIG. 3A, for a general operation, the output of the circuit of the critical-path 11, which is original output signal, is stable before the next clock positive edge, and the output of the circuit of the characterized-path 13, which is characterized output signal, is ready before the negative edge. The character monitor 15 checks the output of the circuit of the characterized-path 13 at the clock negative edge $t_2$ and predict the original output of the selected path meets the timing requirement. In this condition, the character monitor 15 does not trigger the character adjuster 17 to change the supply voltage of the circuit of the critical-path 11.

As shown in FIG. 3B, the characterized output signal is not settled before the negative edge of the clock signal (the time point $t_2$), and character monitor 15 detects output at $t_2$ and finds that the selected path (critical-path) is going to fail the timing requirement. That is, if the condition of the circuit of the critical-path 11 remains the same, the original output signal maybe not ready before the next positive edge of the clock signal.

Accordingly, the character monitor 15 controls the character adjuster 17 to increase the supply voltage of the critical path to speedup the path delay to avoid error occurs on selected path. The character monitor 15 controls the character adjuster 17 to setting the supply voltage of the circuit of the critical-path 11 to a default value in the next cycle of the clock.

Figure 4A:
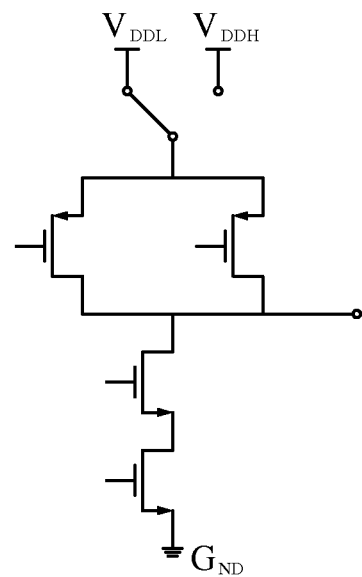
FIG. 4A is a schematic of a dynamically voltage adjustable logic circuit in accordance with one embodiment of this disclosure.

FIG. 4A is an exemplary circuit for the supply voltage switch in accordance with one embodiment of this disclosure. As shown in FIG. 4A, the supply voltage of the NAND-gate may be switched between a low voltage supply $V_{DDL}$ and a high voltage supply $V_{DDH}$ by the two PMOS switches. In one embodiment, the low supply voltage $V_{DDL}$, the high supply voltage $V_{DDH}$, and the switches are part of the character adjuster 17. The character adjuster 17 controls the switches of the exemplary NAND-gate according to the control signal from the character monitor 15. The gate delay of the NAND-gate at the $V_{DDH}$ is faster than the unit delay of the NAND-gate at $V_{DDL}$. Hence, the gate delay of the NAND-gate may be adjusted by changing the supply voltage.

In another embodiment, the low voltage supply $V_{DDL}$ and high voltage supply $V_{DDH}$ are supplied by the character adjuster 17, but the switches are attached on the logic gates of the circuit of the critical-path 11. In other words, the low voltage supply $V_{DDL}$ and the high voltage supply $V_{DDH}$ are two voltages among the plurality of supply voltages VDD1~VDD3.

Figure 4B:
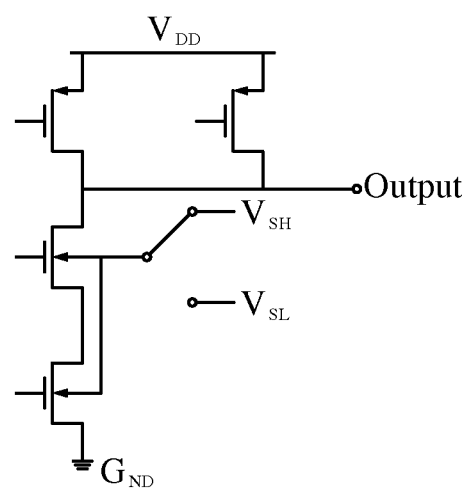
FIG. 4B is a schematic of a dynamically voltage adjustable logic circuit in accordance with one embodiment of this disclosure.

In another embodiment, please refer to FIG. 4B, which is a schematic of a dynamically voltage adjustable logic circuit in accordance with one embodiment of this disclosure. As shown in FIG. 4B, the body terminal (the reference voltage) of the n-type MOSFET of the NAND-gate is selectively connected to the low voltage supply $V_{SL}$ or the high voltage supply $V_{SH}$. It is known according to the body effect that the threshold voltage $V_{th}$ of the n-type MOSFET is inversely correlated to the voltage of the body terminal of the n-type MOSFET. As such, the threshold voltage $V_{th}$ of the n-type MOSFET is decreased when the voltage of the body terminal of the n-type MOSFET of the NAND-gate is increased, and accordingly the driving ability of the NAND-gate is increased and the unit delay of the NAND-gate is so reduced. According to the embodiment, the voltage of the body terminal can be treated as the aforementioned first voltage, and the path delay of the NAND-gate, the unit delay, can be adjusted by adjusting the first voltage. Although it is mentioned that the first voltage may be switched between two voltage values, it is possible that the first voltage may be switched between more than two different voltage values.

Figure 5A:
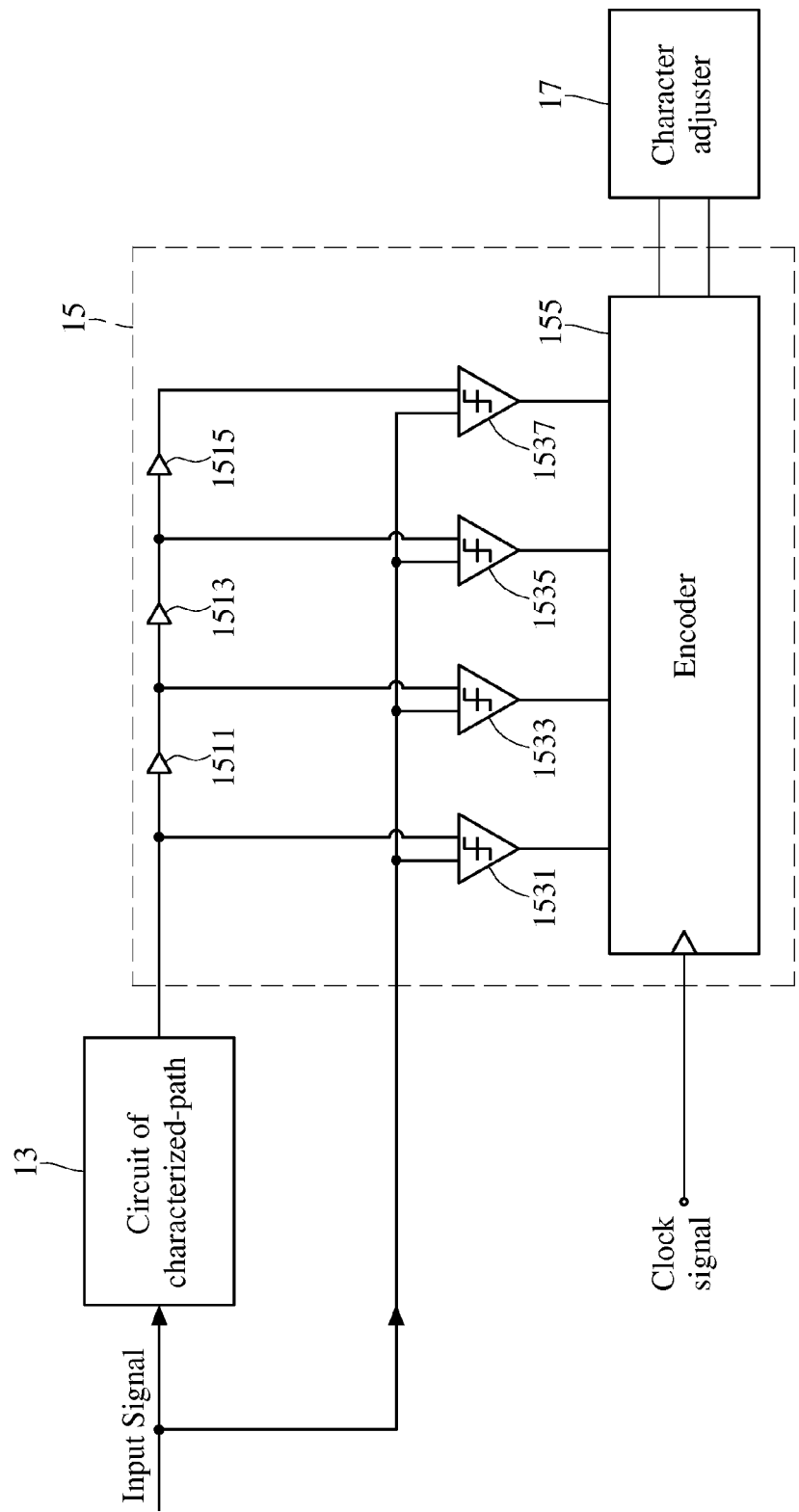
FIG. 5A is a functional block diagram of the character monitor in accordance with one embodiment of this disclosure.
Figure 5B:
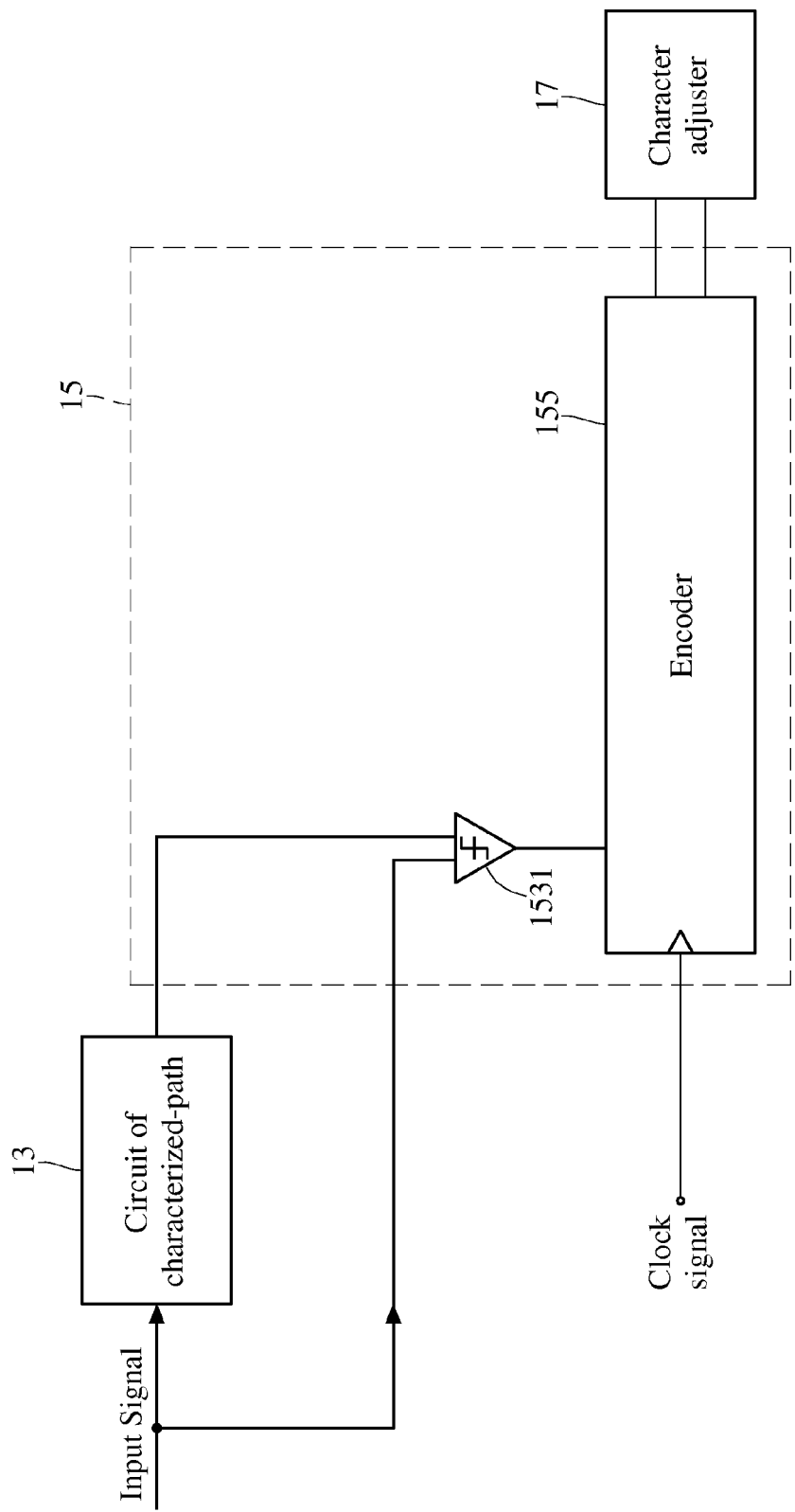
FIG. 5B is a functional block diagram of the character monitor in accordance with another embodiment of this disclosure.

In one embodiment, please refer to FIG. 5A and FIG. 5B for how to determine whether the characterized output signal is stable/settled to predict whether the original output signal meets the timing requirement, wherein FIG. 5A is a exemplary functional block diagram of the character monitor 15 in accordance with one embodiment of this disclosure and FIG. 5B is a functional block diagram of the character monitor 15 in accordance with another embodiment of this disclosure. It is shown in FIG. 5A that the character monitor 15 may comprise one or more delay cell 1511~1515, a plurality of comparators 1531~1537, and an encoder 155. The encoder 155 is electrically coupled to the plurality of comparators 1531~1537. The comparator 1531 is directly connected to the circuit of the characterized-path 13, and each of the comparators 1533~1537 connects to each of the delay cell 1511~1515. All of the comparators 1531~1537 is connected between the input signal and the encoder 155.

The output of the circuit of the characterized-path 13 is delayed and then compared with the expected logic (the correct value of the characterized-path output). The delay cell is designed to make the results the first two comparators (1531 and 1533) match with the expected logic and the results of the last two comparators (1535 and 1537) mismatch with the expected logic. The encoder 155 latches the results from the comparators 1531~1537; in general case the 4-bit result are 1100 in binary. Based on the latched data, the encoder 155 can know the timing change of circuit of the characterized-path 13. For example, for some reason, the circuit of characterized-path 13 runs slower so that the inputs to second comparator 1533 are mismatch with the expected logic and then the latched 4-bit data is 1000. When the characterized-path runs faster, the inputs to third comparator 1535 are match with the expected logic and then the latched 4-bit data is 1110.

For example, each of comparators 1511~1515 has a path delay as long as 0.1 nanosecond (ns). If all of the four comparing signals are determined by the encoder 155 to be correct as predicted, it means the characterized output signal is stable and correct, and the original output signal will be settled before the next positive edge of the clock signal. If the comparing signal from the comparator 1537 is incorrect but other comparing signals are correct, the characterized output signal is stable at 0.3 ns before the negative edge of the clock signal, and the original output signal is expected to be settled before the next positive edge of the clock signal. If both of the comparator 1535 and comparator 1537 generate incorrect comparing signals but other comparing signals are correct, the characterized output signal is stable at 0.2 ns before the negative edge of the clock signal, and the original output signal is expected to be settled before the next positive edge of the clock signal. If the comparator 1535 generates incorrect comparison signal but the other three comparators generate correct comparison signals, the characterized output signal is stable at 0.2 ns before the negative edge of the clock signal, and the original output signal is expected to be settled before the next positive edge of the clock signal. If all comparing signals are incorrect, the characterized output signal is incorrect or, equivalently speaking, not stable or settled, before the negative edge of the clock signal, and the original output signal is expected to be wrong at the next positive edge of the clock signal. Briefly, the path delay of the circuit of the critical-path 11 may be predicted as depicted above, and so does the delay of the original output signal of the whole circuit. Accordingly, the control signal may be generated by the character monitor 15 to control the character adjuster 17 to adjust the first voltage, such as the supply voltage of the circuit of the critical-path 11 or the body bias voltage of the circuit of the critical-path 11.

As shown in FIG. 5B, compared with the character monitor 15 in FIG. 5A, the character monitor 15 in FIG. 5B has the comparator 1531 only. If the comparing signal from the comparator 1531 is incorrect, the original output signal is expected to be incorrect at the next positive edge of the clock signal, and the control signal is then generated to control the character adjuster 17 to adjust the first voltage.

Figure 6A:
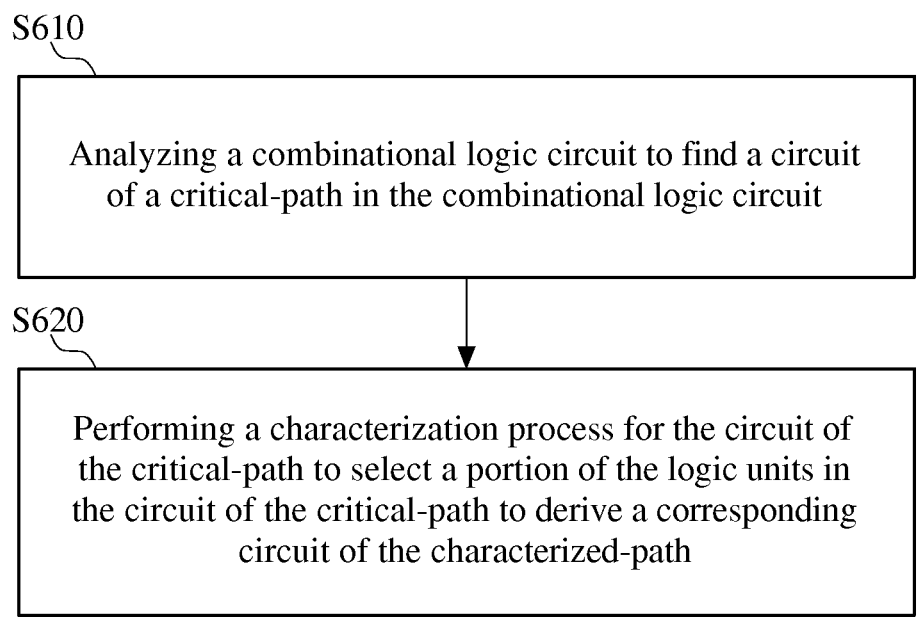
FIG. 6A is a flowchart of the method for generating the circuit of the characterized-path in accordance with one embodiment of this disclosure.

In one embodiment, the aforementioned circuit of the characterized-path 13 may be generated according to the following process. Please refer to FIG. 6A, which is a flowchart of the method for generating the circuit of the characterized-path 13 in accordance with one embodiment of this disclosure. As depicted in step S610, a combinational logic circuit is analyzed by a processor or a computer and a circuit of a critical-path in the combinational logic circuit is found. As depicted in step S620, a characterization process is performed for the circuit of the critical-path by the processor or the computer to select a portion of the logic units in the circuit of the critical-path to derive a corresponding circuit of the characterized-path. At least one second characteristic of the circuit of the characterized-path is essentially proportional to at least one first characteristic of the circuit of the critical-path. The circuit of the characterized-path is applied to predict whether the first characteristic, such as the original path delay of the circuit of the critical-path, the original power consumption of the circuit of the critical-path, the original power efficiency of the circuit of the critical-path, the original complexity of the logic units of the circuit of the critical-path, and the original noise margin of the circuit of the critical-path, meets the circuit requirement.

Figure 6B:
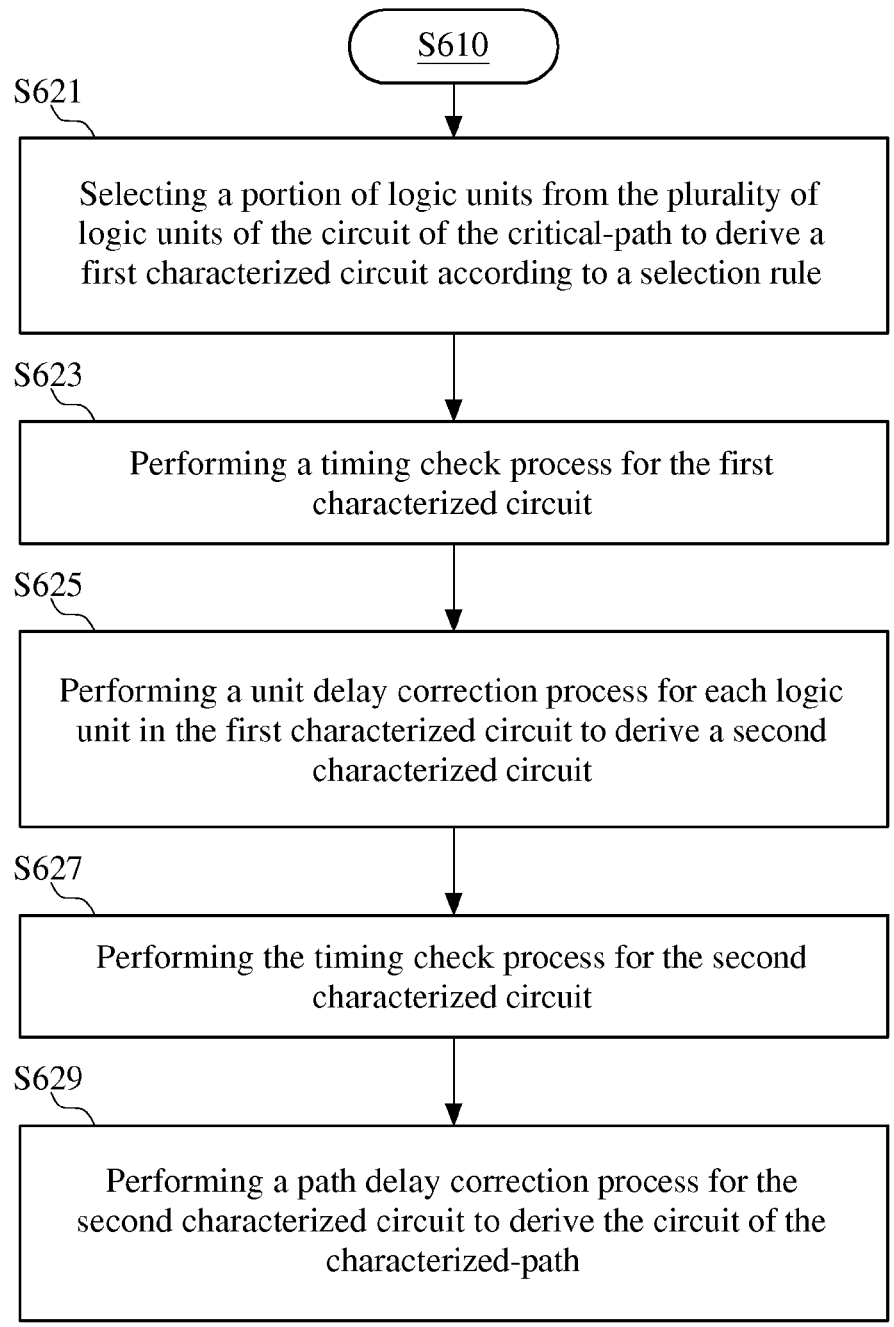
FIG. 6B is a flowchart of the step S620 in accordance with one embodiment of this disclosure.

In one embodiment, please refer to FIG. 6B to understand the detail about the step S620, wherein FIG. 6B is a flowchart of the step S620 in accordance with one embodiment of this disclosure. As depicted in step S621, the processor may select a portion of logic units from the plurality of logic units of the circuit of the critical-path to derive a first characterized circuit according to a selection rule. As depicted in step S623, the processor performs a timing check process for the first characterized circuit. As depicted in step S625, the processor may perform a unit delay correction process for each logic unit in the first characterized circuit to derive a second characterized circuit. As depicted in step S627, the processor performs the timing check process for the second characterized circuit. As depicted in step S629, the processor may perform a path delay correction process for the second characterized circuit to derive the circuit of the characterized-path.

Figure 6C:
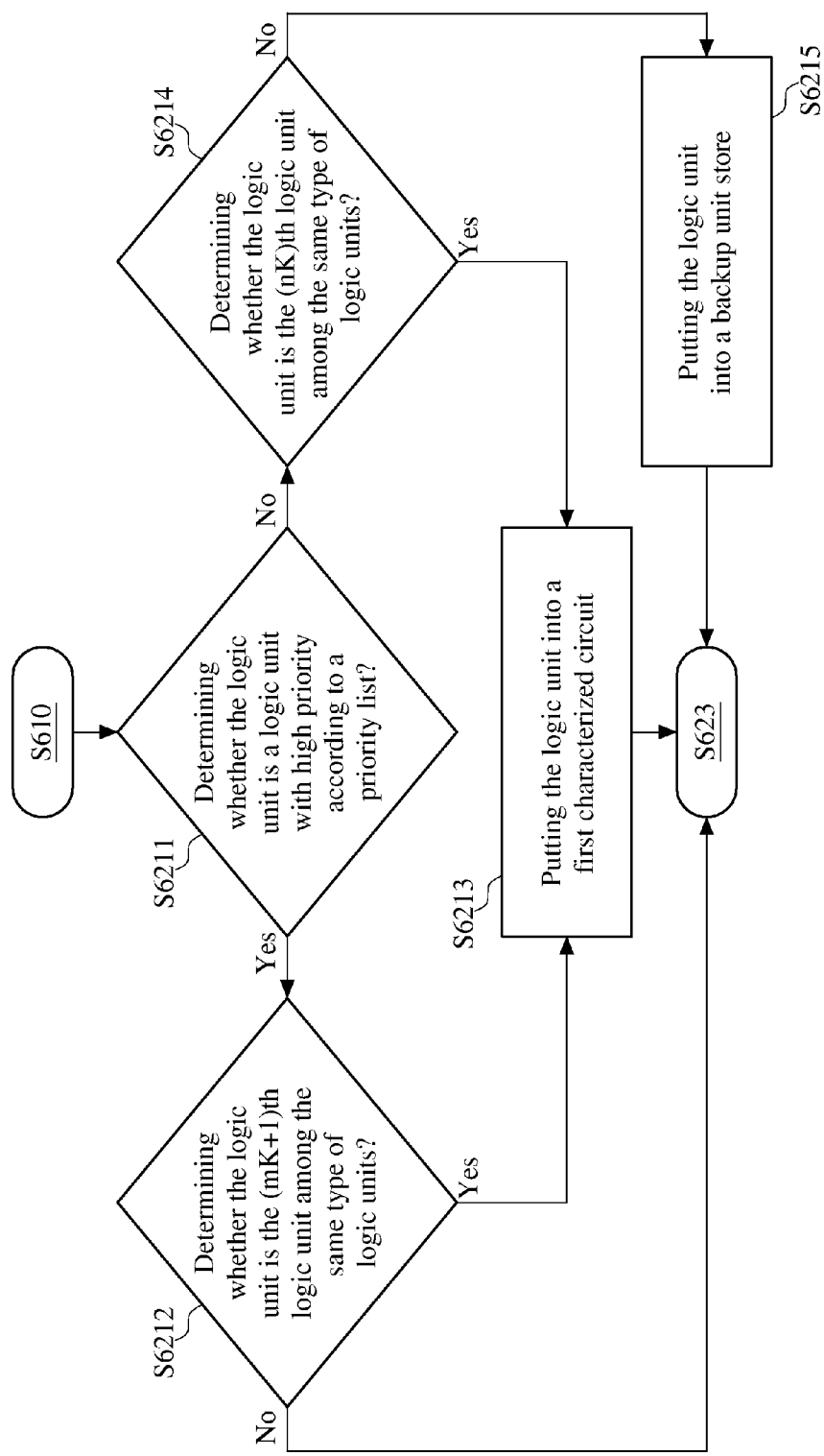
FIG. 6C is a flowchart of the step S621 in accordance with one embodiment of this disclosure.

In one embodiment, please refer to FIG. 6C for understanding the detail process about the step S621, wherein FIG. 6C is a flowchart of the step S621 in accordance with one embodiment of this disclosure. In the step S621, the processor performs the process as shown in FIG. 6C for each logic unit among the plurality of logic units in the circuit of the original critical-path. Briefly speaking, assume that M logic units with longer path delay belong to a first category of logic units and N logic units with shorter path delay belong to a second category of logic units. M and N are positive integers. The first category of logic unit is the logic unit with high priority, while the second category of logic unit is the logic unit with low priority.

As depicted in step S6211, the processor determines whether the logic unit is a logic unit with high priority according to a priority list. If the logic unit is a logic unit with high priority, as depicted in step S6212, the processor determines whether the logic unit is the $(mK+1)^{th}$ logic unit among the same type of logic units, wherein m is a non-negative integer not larger than M/K. For example, if K is four and the first type logic unit is the NAND gate, the $1^{st}$ NAND gate, the $5^{th}$ NAND gate, the $9^{th}$ NAND gate, . . . and the $(4m+1)^{th}$ NAND gate pass the judgment and other NAND gates fail to pass the judgment. If the logic unit passes the judgment, as depicted in step S6213, the processor put the logic unit into a first characterized circuit. In other words, P first type logic units among the plurality of first type logic units are selected and put into the first characterized circuit, wherein P is a minimum positive integer not less than M/K.

If the logic unit fails to pass the judgment of the step 6211, as shown in step S6214, the processor may determine whether the logic unit is the $(nK)^{th}$ logic unit among the same type of logic units in the critical-path circuit, wherein n is a positive integer not greater than N/K. If K is equal to four and the second type logic unit is NOT gate, the $4^{th}$ NOT gate, the $8^{th}$ NOT gate . . . and the $(4n)^{th}$ NOT gate can pass the judgment but other NOT gates cannot pass the judgment. If the logic unit passes the judgment, the processor put the logic unit into the first characterized circuit as depicted in step S6213. If the logic unit fails to pass the judgment, as depicted in step S6215, the logic unit is put into a backup unit store. In other words, Q second type logic units among the plurality of second type logic units are selected and put into the first characterized circuit, wherein Q is a maximum positive integer not greater than N/K. As brief, the processor selects the logic unit(s) according to a selection rule comprising the path delay parameter K and the priority list.

In other embodiments, the selection rule may comprise a power consumption parameter and a priority list when the purpose of performing the characterization process is to generate a circuit of characterized-path indicating the power consumption of the circuit of critical-path. In such case, the power consumption parameter is for defining a ratio between the power consumption of the circuit of critical-path and the power consumption of the circuit of characterized-path, and the logic unit in the priority list doesn't have to be the logic unit with longer path delay but the logic unit with more power dissipation.

In one embodiment, the logic units in the circuit of critical-path can be classified as more than two categories. Specifically, the logic units can be classified as a logic unit of the first priority, a logic unit of the second priority . . . , and a logic unit of the $M^{th}$ priority. In such embodiment, the amount of the logic unit of the first priority in the circuit of the characterized-path is no less than the amount of the logic unit of the second priority in the circuit of the characterized-path. With the same manner, the amount of the logic unit of the $(M-1)^{th}$ priority in the circuit of the characterized-path is no less than the amount of the logic unit of the $M^{th}$ priority in the circuit of the characterized-path. As such, the circuit of the characterized critical path may better describe the effect of the logic units with higher priority, which mainly affects the original path delay of the critical-path circuit.

Figure 6D:
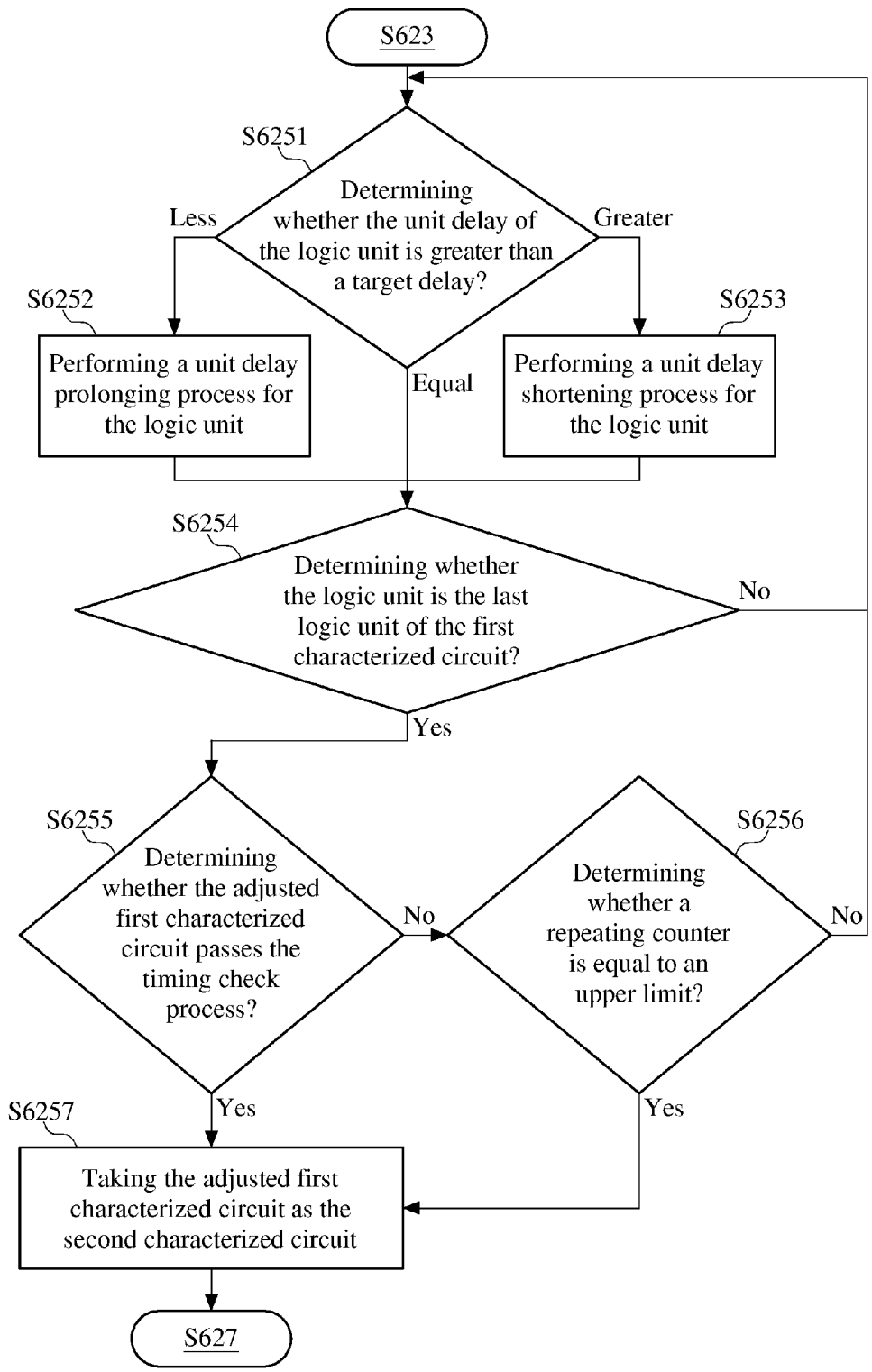
FIG. 6D is a flowchart of the step S625 in accordance with one embodiment of this disclosure.

In one embodiment, please refer to FIG. 6D for understanding the detail process of the step S625, wherein FIG. 6D is a flowchart of the step S625 in accordance with one embodiment of this disclosure. In the present embodiment, the processor performs the process as illustrated in FIG. 6D for each logic unit in the first characterized circuit. As depicted in step S6251, the processor determines whether the unit delay of the logic unit is greater than a target delay, which is a standard unit delay. If the unit delay of the logic unit is less than the target delay, as depicted in step S6252, the processor performs a unit delay prolonging process for the logic unit. If the unit delay of the logic unit is greater than the target delay, as depicted in step S6253, the processor performs a unit delay shortening process for the logic unit. If the unit delay of the logic unit is equal to the target delay, as depicted in step S6254, the processor determines whether the logic unit is the last logic unit of the first characterized circuit. If the logic is not the last logic unit of the first characterized circuit, the processor goes back to the step S6251 to perform the flow for the next logic unit. If the logic unit is the last logic unit of the first characterized circuit, as depicted in step S6255, the processor determines whether the adjusted first characterized circuit passes the timing check process. If the first characterized circuit cannot pass the timing check process, as depicted in step S6256, the processor determines whether a repeating counter related to the process of the step S625 is equal to an upper limit. If the repeating counter is not equal to the upper limit, the processor goes back to the step S6251 to repeat the flow for the logic unit. Otherwise, as depicted in step S6257, the processor takes the adjusted first characterized circuit as the second characterized circuit.

The aforementioned unit delay prolonging process may comprise decreasing the size of a logic unit to decrease the driving ability of the logic unit, adding an additional loading capacitor and/or increasing the size of the next logic unit so as to increase the loading of the logic unit. The aforementioned unit delay shortening process may comprise increasing the size of a logic unit to increase the driving ability of the logic unit, removing the loading capacitor and/or decreasing the size of the next logic unit to decrease the loading of the logic unit.

Figure 6E:
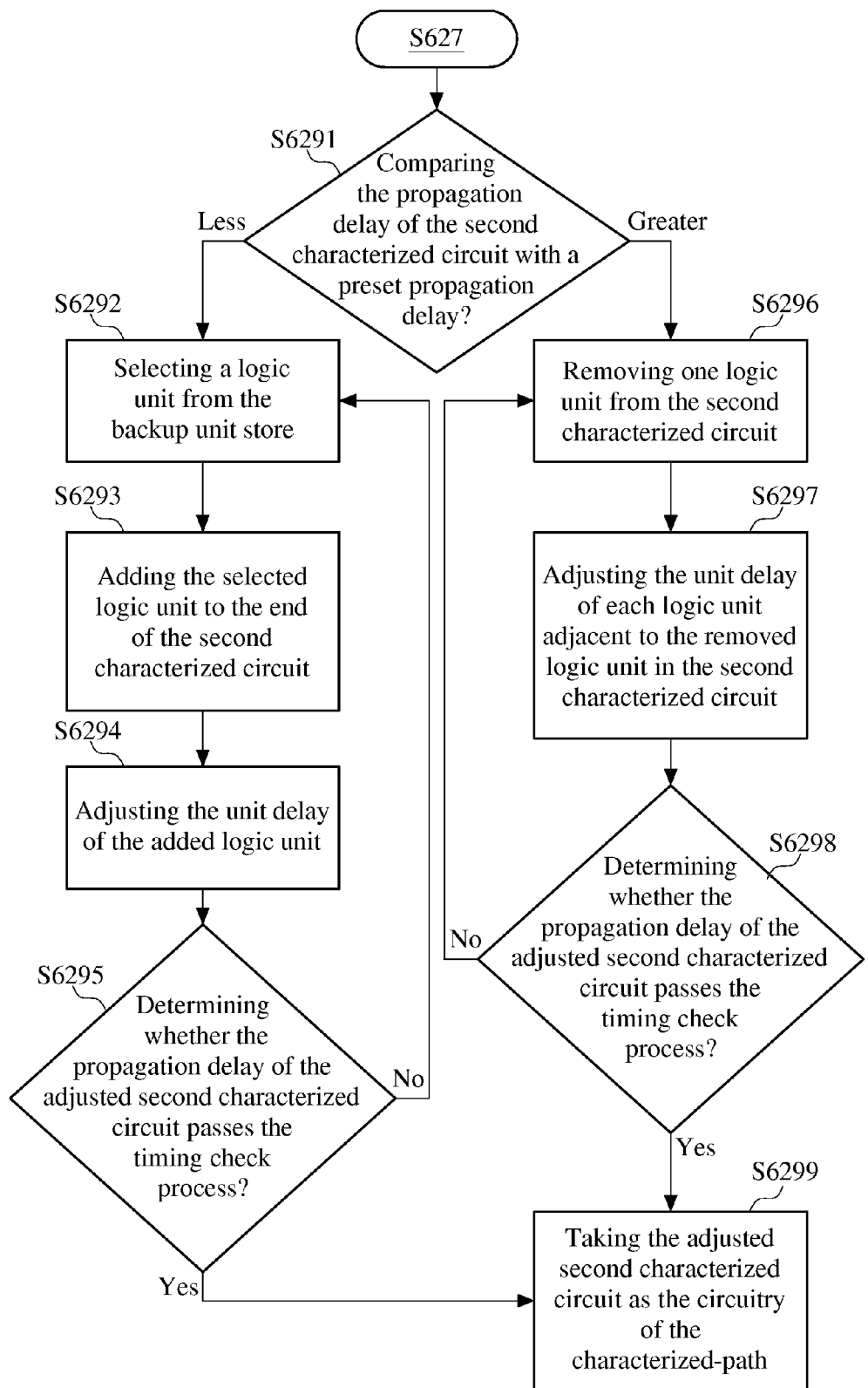
FIG. 6E is a flowchart of the step S629 in accordance with one embodiment of this disclosure.

In one embodiment, please refer to FIG. 6E for understanding the detail process of the step S629, wherein FIG. 6E is a flowchart of the step S629 in accordance with one embodiment of this disclosure. As depicted in step S6291, the processor compares the path delay of the second characterized circuit with a preset path delay. The preset path delay is the characterized-path delay determined according to the original path delay and the path delay parameter.

If the path delay of the second characterized circuit is less than the preset path delay, as depicted in step S6292, the processor selects a logic unit from the backup unit store, and, as depicted in step S6293, the processor adds the selected logic unit to the end of the second characterized circuit so as to prolong the path delay of the second characterized circuit. Then, as depicted in step S6294, the processor adjusts the unit delay of the added logic unit according to the preset path delay and the path delay of the second characterized circuit so as to make the path delay of the second characterized circuit equal to the preset path delay. Further, as depicted in step S6295, the processor determines whether the path delay of the adjusted second characterized circuit passes the timing check process. If the path delay of the second characterized circuit cannot pass the timing check process, the processor goes back the step S6292 to repeat the process. Also, the procedure from the step S6292 to the step S6295 may also be called as a path delay prolonging process.

If the path delay of the second characterized circuit is larger than the preset path delay, as depicted in step S6296, the processor remove one logic unit from the second characterized circuit according to the unit statistic data, and, as depicted in step S6297, the processor adjusts the unit delay of each logic unit adjacent to the removed logic unit in the second characterized circuit. The method for adjusting the unit delay is illustrated as the unit delay prolonging process or the unit delay shortening process. Then, as depicted in step S6298, the processor determines whether the path delay of the adjusted second characterized circuit passes the timing check process. If the path delay of the adjusted second characterized circuit cannot pass the timing check process, the processor goes back to the step S6296. The procedure from the step S6296 to the step S6298 can be called as a path delay shortening process. After the path delay prolonging process or the path delay shortening process is performed, as depicted in step S6299, the processor takes the adjusted second characterized circuit as the circuit of the characterized-path.

Please now refer to FIG. 7, which is a flowchart of the control method of the dynamically adjustable circuit in accordance with one embodiment of this disclosure. As depicted in step S710, the character monitor 15 predict whether the original output signal of the circuit of the critical-path 11 will be incorrect or fail to be settled before the next positive edge of the clock signal. If the original output signal is predicted to be incorrect, as depicted in step S720, the character monitor 15 controls the character adjuster 17 to adjust, that is, to increase, the first voltage so as to decrease/shorten the path delay of the circuit of the critical-path 11 in the present cycle of the clock signal. Otherwise, as depicted in step S730, the character monitor 15 controls the character adjuster 17 to adjust, that is, to decrease, the first voltage so as to increase the path delay of the circuit of the critical-path 11 and decrease the power dissipation of the circuit of the critical-path 11 in the next cycle of the clock signal. In one embodiment, the operation of frequently increasing/decreasing the voltage may consume more power, so, in the step S730, it is not necessary to decrease the first voltage in the next cycle of the clock signal. In other words, it is not necessary to adjust the first voltage each cycle of the clock signal.

According to the method disclosed in one or more embodiments of this disclosure, a circuit of the characterized-path corresponding to a circuit of the critical-path may be generated. The circuit of the characterized-path is essentially proportional or similar to the circuit of the critical-path in certain characteristics or properties, so the circuit of the characterized-path can be used for indicating certain characteristics or properties of the critical-path circuit. Hence, whether the circuit of the critical-path meets the circuit requirement can be determined, predicted, adjusted, and controlled according to the circuit of the characterized-path. According to another embodiments of this disclosure, the integrated circuit adjusts the supply voltages, the body reference voltages, and/or the threshold voltages to make the circuit operate with constant operating frequency or to lower power consumption.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An integrated circuit, comprising:
   at least one first circuit having a first character and at least one external control signal; and
   a character control unit controlling the at least one of the external control signal, the character control unit comprises:
      a second circuit with a second character that is essentially proportional to but not equal to the first character;
      a character adjuster adjusting the at least one external control signal; and
      a character monitor monitoring an operating behavior of the second circuit to control the character adjuster to adjust the at least one external control signal.

2. The integrated circuit according to claim 1, wherein the character adjuster adjusts the at least one external control signal of the first circuit to make the at least one first circuit operate with a constant operating frequency or to lower a power consumption of the first circuit.

3. The integrated circuit according to claim 2, wherein the character adjuster includes at least two supply voltages, at least two body reference voltages, and/or at least two threshold voltages, and the character adjuster adjusts at least one of the supply voltages, the body reference voltages, and/or the threshold voltages of the first circuit based on an adjusting signal generated by the character monitor.

4. A method, comprising:
   providing a first circuit;
   analyzing a first character associated with the first circuit, comprising:
      selecting a first circuit from an integrated circuit as a circuit of critical-path which comprises a first plurality of logic gates; and
      performing a characterization process on the circuit of critical-path to obtain a circuit of characterized-path which comprises a second plurality of logic gates; and
   generating a second circuit with a second character essentially proportional to but not equal to the first character;
   wherein at least one second character of the circuit of characterized-path is essentially proportional to at least one first character of the circuit of critical-path, and the circuit of characterized-path is used to represent whether the first circuit meets a functional requirement.

5. The method according to claim 4, wherein the performing the characterization process comprises:
   selecting the second plurality of logic gates based on the first plurality of logic gates according to a selection rule; and
   forming the circuit of characterized-path with the selected second plurality of logic gates.

6. The method according to claim 5, wherein the selection rule comprises:
   a delay parameter for defining a ratio between a path delay of the first circuit and a path delay of the second circuit.

7. The method according to claim 5, wherein the selection rule comprises a delay parameter for defining a ratio of cell delays between of the cells in the first circuit and the cells in the second circuit.

8. The method according to claim 5, wherein the selection rule comprises a cell complexity for defining a priority of logic gates for recording a plurality of high priority logic units among the logic gates.

9. The method according to claim 5, wherein the selection rule comprises a power consumption parameter for defining a ratio between a power consumption of the first circuit and a power consumption of the second circuit.

10. The method according to claim 5, wherein the at least one second character is selected from the group consisting of a path delay, a timing, a power consumption, a complexity of the logic gates, and a noise margin.

* * * * *